United States Patent [19]
Müller et al.

[11] Patent Number: 5,354,963
[45] Date of Patent: Oct. 11, 1994

[54] PROCESS AND A DEVICE FOR CONTINUOUS SURFACE TREATMENT OF ROD-SHAPED, LONGITUDINALLY EXTENDED MATERIALS WITH METAL SURFACES USING A MAGNETICALLY DISPLACED PLASMA ARC

[75] Inventors: Volker Müller; Manfred Fehn, both of Saalfeld, Fed. Rep. of Germany

[73] Assignee: SKET Schwermaschinenbau Magdeburg, Magdeburg, Fed. Rep. of Germany

[21] Appl. No.: 39,986

[22] Filed: Mar. 30, 1993

[30] Foreign Application Priority Data

Mar. 31, 1992 [DE] Fed. Rep. of Germany ....... 4211167

[51] Int. Cl.[5] .................. B23K 9/00; B23K 9/013; B23K 9/06
[52] U.S. Cl. .................. 219/121.54; 219/121.37; 219/121.38; 219/121.59; 219/123; 148/565
[58] Field of Search ........ 219/121.59, 121.54, 219/121.57, 121.37, 121.38, 123; 148/525, 565

[56] References Cited
U.S. PATENT DOCUMENTS
3,146,336  8/1964  Whitacre .................. 219/121.54

FOREIGN PATENT DOCUMENTS
1262195  3/1968  Fed. Rep. of Germany .
3041095  5/1982  Fed. Rep. of Germany .
3041119  1/1984  Fed. Rep. of Germany .
3110121  12/1988  Fed. Rep. of Germany .

Primary Examiner—Mark H. Paschall
Attorney, Agent, or Firm—Weingarten. Schurgin, Gagnebin & Hayes

[57] ABSTRACT

The invention concerns a process and a device for surface heat treatment of rod-shaped, longitudinally extended materials with metal surfaces by means of an arc, which rotates and is magnetically driven around the axis of the billet, wherein the arc moves between an annular electrode (anode) and the billet serving as cathode that runs through it.

According to the invention, the problem of developing improved measures for stabilizing an arc, inter alia, is solved by rotating the arc by a direct current magnet arranged behind the annular electrode in the direction in which the billet runs and at the same time the magnetic field induced by the direct current magnetic counteracts the pulling effect on the arc base point by the moved billet and the annular electrode current is divided into two divided currents.

The field of application is primarily surface heat-treating of rod-shaped, longitudinally extended materials with metal surfaces.

14 Claims, 1 Drawing Sheet

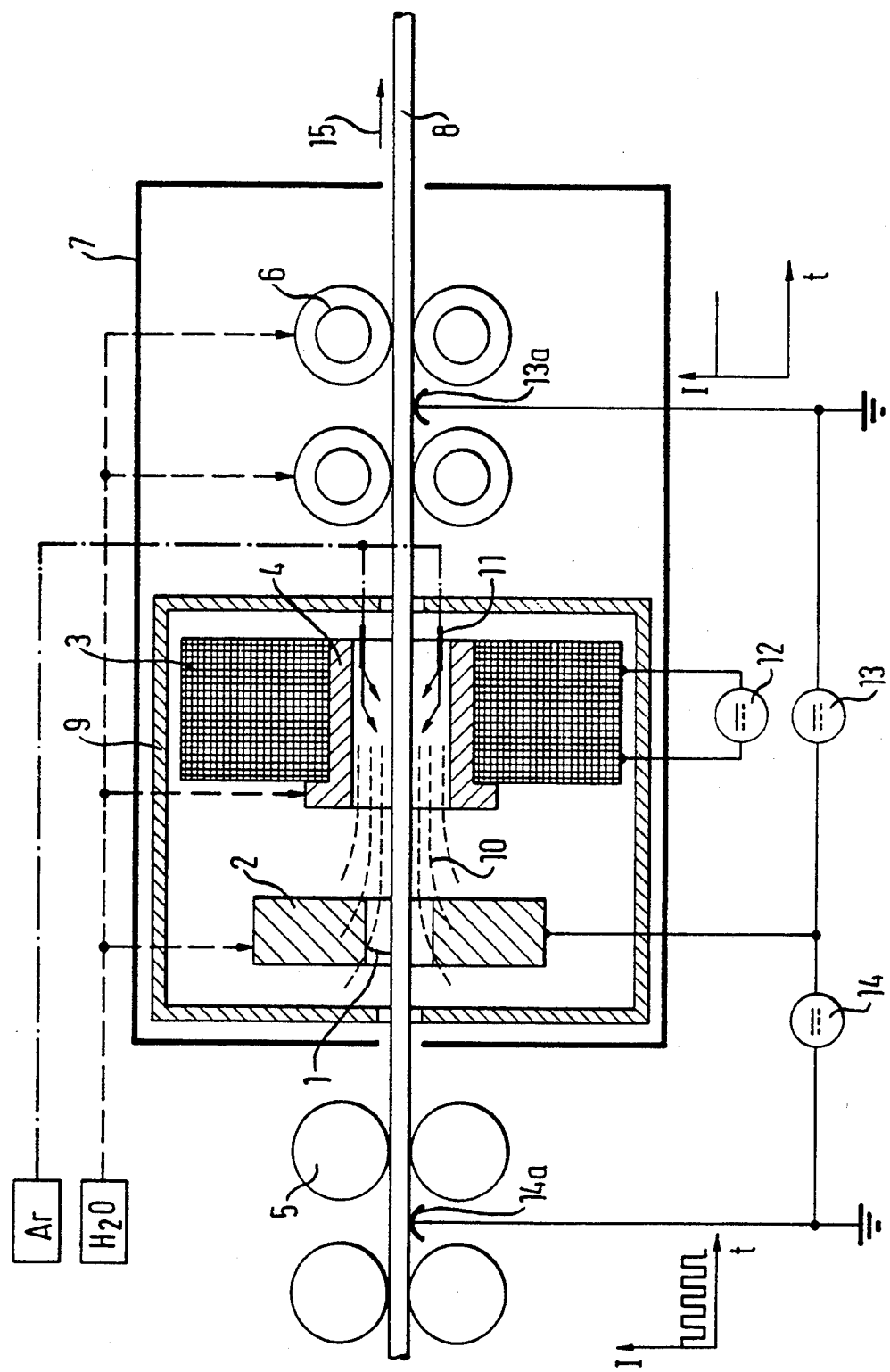

PROCESS AND A DEVICE FOR CONTINUOUS SURFACE TREATMENT OF ROD-SHAPED, LONGITUDINALLY EXTENDED MATERIALS WITH METAL SURFACES USING A MAGNETICALLY DISPLACED PLASMA ARC

The invention concerns a process and a device for surface treatment of rod-shaped, longitudinally extended materials with metal surfaces by means of an arc of the sort specified in the Preamble to Patent claims 1 (process) and 8 (device), Steel is still the dominant material worldwide, since it can be used universally and is environmentally friendly. When it is used, the problem is to eliminate corrosion and to minimize the attendant economic losses. Special attention must be paid to this problem in the construction and wire cable industry, because here especially high requirements must be met for corrosion-resistance even after long periods of operation. Galvanized or plastic-coated steel wires often do not meet the requirements for reliable corrosion protection. Solid high-grade steel wires are too expensive for many applications or do not meet the requirements for strength and aging strength.

To improve corrosion protection, strip material in particular is coated by plating it with non-corrosive materials.

U.S. Pat. No. 3,211,886 describes an arc cleaning, plasma-generating device that contains an annular anode through which a metal billet to be processed is passed. This anode is divided in half lengthwise to conduct an inert gas fed from both sides along the length of the wire. The halves of the anode are connected electrically to one another. The two gas currents form a round resting zone, where an arc can burn, at the entry to the outflow channel in the anode. The arc is made to rotate by a two-piece magnetic coil, one half of which is arranged in font of the annular anode and the other half in back. Both halves of the coil and the anode are connected in series electrically, so the coil windings consist of water-cooled copper pipe. The arc rotates between the annular anode, and the electrically conductive rod going through it. The two gas currents fed opposite one another into the anode should prevent the arc from leaving the anode area due to the pulling effect on the rod moved. The disadvantage is that the magnetic coil and the anode are connected in series and so there can be no independent control of the magnetic current and the anode current.

DE-AS 12 62 195 makes known a device to free a metal surface of scales and other impurities by the periodic effect of heat and mechanical treatment with a drum-shaped tool made of laminates. The known device includes a large number of ring-shaped laminates with radial play, spaced apart and evenly distributed on a collar of supporting bolts sitting on a disk and arranged so that they can be moved radially, wherein this drum-shaped tool and the metal surface are connected to the poles of a current source, in order to produce an arc between the tool and the metal surface. However, this known device is only suitable for processing workpieces with large surfaces, like for example the surface of sheet metal, while longitudinally extended workpieces, like wires, pipes or strips, for example, cannot be processed with this device or cannot be freed of impurities.

DE-B-31 10 121 describes a device for arc processing a narrow strip of metal which works on the top and bottom at the same time in a vacuum chamber with an expanded arc. The strip is fed into the chamber on a deflection roller, so that the strip leaving the chamber runs under the electrode next to the strip going in. This device is not suitable for processing workpieces that rotate symmetrically.

DE-B-30 41 095 makes known an arc device for surface processing long workpieces that works with two arcs, in which the top and bottom of the workpiece are each treated with an arc.

DE-PS 30 41 119 describes a device for processing long workpieces by means of an arc discharge, in which a workpiece is treated on the top and bottom inside a vacuum chamber by means of two non-rotating arcs. The last two devices mentioned are suitable only for surface-cleaning flat, strip-shaped material.

The task of the invention is to specify a process for preferably thermal surface treatment of rod and billet-shaped materials with electrically conductive surfaces, with which the disadvantages of the state of the art are overcome and an even energy yield that can be controlled sensitively is achieved over the entire surface of the material. Furthermore, a suitable device should be created that can operate according to the process in the invention.

This task is solved by the characteristics specified in claims 1 (process) to 8 (device).

According to the invention, the annular electrode concentrically surrounding the billet and the arc produced on the surface of the billet are moved by the magnetic field in a circumferential or rotational movement around the billet. By arranging the magnetic coil at a suitable axial distance behind the annular electrode, in addition to the rotation effect of the arc through the course of the field lines, which are propped open like a fan, a force is exerted on the arc, especially on its base point on the surface of the billet which is opposed to the flow direction of the billet and thus counteracts the undesired pulling effect. The fact that the invention divides the arc current into two divided currents fed to the billet in front and in back of the annular electrode via sliding contacts makes possible simple, effective control of the arc current and yields low thermal stress on the billet. As a result of the measures in the invention, a stable permanent arc is achieved which rotates around the billet at an uniform speed that can be influenced and guarantees a uniform heat yield in the layers of the billet material near the surface without local overheating. By mutual agreement, for example, on the flow speed of the billet or the rod material, the axial distance between the annular electrode and the magnetic coil, the size and type of the current generating the magnetic field and the arc, the heat yield in the billet material can be controlled and, for example, limited to the wall areas near the surface. Thus the invention allows effective, thermal separation of surface layers and caking, i.e., effective cleaning of the surface of the billet. Furthermore, the outer layer can be heated selectively by composite billets composed of various layers of material, which is an advantage, for example, in multi-step drawing of such composite billets, if the material in the outer layer only has to be soft-annealed or surface hardened.

The desired positional stability of the rotating arc can also be improved by the use of a pulsed arc current, because in this way the adhesion of the arc base point to a spot on the surface of the billet flowing through and thus the pulling effect can be avoided, opening up additional possibilities of control. Similarly advantageous effects are yielded by pulse superposition of at least one of the two divided electrical currents.

Depending on the material properties of the billet material to be treated, it can be efficient to conduct a current of inert gas against the arc and onto the section of heated billet, which causes additional positional stabilization of the rotating arc and at the same time selective surface cooling of the billet.

Thermal surface treatment according to the process in the invention by means of the device in the invention can be carried out, on one hand, as intermediate annealing of high-grade steel-plated wire in the course of drawing and forming, wherein only the sheathing material is influenced by the heat. On the other hand, it can also be used for tempering high-strength steel wire to prevent the formation of stress cracks or to eliminate adhesively bound surface layers on metal rods.

The invention offers the following advantages. The heat yield takes place with very high heat transfer coefficients directly through the surface of the workpiece to be treated. The heat yield occurs evenly, concentrically and is relatively insensitive to positional deviations of the workpiece to be treated within the annular anode. The process has a high thermal degree of effectiveness. Parameters like the amount of heat, the penetration depth of the heat effect, the cooling speed and the inert gas current can be set with no problem. Since the arc current is composed of several divided currents (DC) that can be set independently of one another, the effect of a force exerted on the base point of the arc can be controlled with technically simple means. The direct current magnet responsible for the arc rotation arranged in the direction in which the rod runs behind the annular electrode causes a force on the arc that counteracts the pulling effect, wherein the distance between the annular electrode and the electromagnet can be chosen or set according to operational criteria. A pulse arc current facilitates the relative movement of the arc on the surface of the billet and thus supports its even rotation. The generating current of the magnetic and the arc current should be able to be set independently of one another. Finally, the special feed of an inert gas current produces, in addition to an intensified cooling of the billet material, a force on the arc, which reduces the pulling effect, and surface pollution of the billet loosed by the arc is immediately blown out of the heat zone.

Other special features and advantages of the invention can be inferred from the following description of a preferred example of embodiment and from the drawing, in which a device for continuous thermal surface treatment of billet material with a metal surface is shown schematically.

In the device shown, an arc 1 is fed by two direct current sources 13, 14 that can be set independently from one another, whose negative outputs are each connected to a sliding contact 13a, 14a arranged in front and in back of the annular electrode 2 in the flow direction 15, via which a divided current is fed to the rod or billet 8. The annular electrode 2 is connected to positive contacts of both current sources 13, 14, wherein an energy yield in the workpiece of 500 to 2,000 J/cm$^2$ for surface annealing and less than 200 J/cm$^2$ for surface cleaning can be attained. The current feeding the arc 1 on the cathode side on the contacts in front and in back of the annular electrodes 2 is divided at a ratio of 1:1.5 to 1:6, so that the result is an arc 1 that is from 2 to 5 mm long.

The annular electrode 2 is in the non-homogeneous magnetic field range outside of a coreless hollow cylindrical DC magnet 3, which is connected to a current source 12 (DC current) and is arranged coaxially to the rod axis. The DC current magnet 3 is arranged in the flow direction 15 at a predetermined and, if necessary, adjustable distance behind the annular electrode 2. The magnetic flow of the DC magnet 3 should be >5,000 A.

The magnetic current (DC current source 12) and arc current can be adjusted separately. The annular electrode 2 and the DC current magnet 3 are within a housing structure symmetrical to the rod axis made of magnetic material 9 that guarantees the magnetic ground.

In the flow direction 15, in front and in back of the annular electrode 2, rod guide rollers 5, 6 are arranged that cause the rod 8 to be centered on the annular electrode 2. The guide rollers 6 arranged in back of the annular electrode 2 are water-cooled. The same applies to the annular electrode 2 and the flow area 4 of the DC current magnet 3. The whole device is inside a box 7 filled with inert gas which contains holes for the billet 8. The inert gas is fed in the direction in which the billet moves behind the annular electrode 2 through nozzles 11, which are aimed at the billet 8 from several sides.

The influence of the arc 1 is strongest due to the current splitting on the cathode side. A divided electrical current fed against the flow direction 15 of the billet 8 causes a force in the same direction on the base point of the arc 1. A second divided electrical current, separate from the first, in the flow direction 15 is necessary in order to be able to control this force effect without moving the base point, with the total arc current (total of the divided currents) constant. Here, it is also positive that the thermal stress on the core material from current splitting can be reduced compared to unilateral current feed.

An external magnetic field, whose field lines 10 run parallel to the axis in the area of the annular electrode 2 makes the arc 1 between the annular electrode 2 and the billet 8 rotate around the billet 8. This rotation produces a component of the arc 1 that is orthogonal to the planes spanned by the magnetic field lines 10 and the ideal arc 1 (rotational components). The external magnetic field is produced by the coreless direct current magnet 3, whose magnetic field lines 10 run parallel to the axis only on the inside near the axis. If the annular electrode is moved out of the axis of the direct current magnet 3, then portions of the magnetic field can be found as the distance from the magnet increases that are orthogonal to the axis of the billet 8 (rod axis) (divergence component). The rotational component of the arc 1, in connection with the divergence component of the magnetic field, yields a force effect on the arc 1, which—independently of the direction of the magnetic field—points away from the direct current magnet 3.

In order to allow the force against the pulling effect that was described to work, the direct current magnet 3 is arranged behind the annular electrode 2 in the direction in which the billet runs.

The current of inert gas goes in the opposite direction from the billet. This causes, for one thing, a force on the arc 1 that reduces the pulling effect and, for another thing, the newly fed cold inert gas flows around the thermally treated hot billet 8 and helps cool it. Moreover, surface impurities on the billet 8, loosened by the arc 1, are immediately blown out of the heat zone.

The superposition of the arc current with pulses leads to the formation of a stiff arc 1. Moreover, the base point of the arc 1 on the cathode side can be moved easily on the surface of the billet. This causes a relative insensitivity to surface flaws on the billet 8. Since the arc rotation frequency is around 500 Hz, a current pulse frequency of around 5 kHz with a pulse height of 15% of the arc current is sought.

We claim:

1. A process for continuous treatment of billet-shaped materials having metal surfaces by means of an arc produced between an annular electrode (2) and a billet (8), said annular electrode defining a billet-treatment orifice and having a billet-entry side and a billet-egress side, comprising the steps of:
  producing a magnetic field (10) proximate said billet-egress side of said annular electrode (2), said magnetic field setting said arc (1) in rotation around said billet (8) and counteracting a pulling of the arc by movement of the billet through said billet-treatment orifice of said annular electrode;
  forming an arc current comprised of first and second unequal currents that can be controlled separately;
  combining said first and second unequal currents at said annular electrode (2) together;
  applying said first unequal current to said billet (8) on said billet-entry side of said annular electrode; and
  applying said second unequal current to said billet on said billet-egress side of said annular electrode (2).

2. The process according to claim 1, wherein said unequal currents have a ratio of 1:1.5 to 1:6.

3. The process according to claim 1, further comprising the step of feeding a flow of inert gas through said billet-treatment orifice defined by said annular electrode opposite a direction of billet movement through said billet-treatment orifice.

4. The process according to claim 1, further comprising the step of cooling said annular electrode (2) and said metal surfaces of said treated billet (8).

5. The process according to claim 1, further comprising the step of superposing onto at least one of said first and second unequal currents a plurality of pulses having an amplitude not greater than 50% of said at least one of said first and second unequal currents and wherein said plurality of pulses has a frequency between 5 and 10 kHz.

6. The process according to claim 1, further comprising the step of superposing onto each of said unequal currents a plurality of pulses having an amplitude not greater than 50% of a respective one of said first and second unequal currents and wherein said plurality of pulses has a frequency between 5 and 10 kHz.

7. The process according to claim 1, further comprising the step of controlling an independent magnetic coil current to produce a magnetic field independent of the arc current.

8. A device for heat treating billet-shaped material, said billet-shaped material having a metal surface, comprising:
  an annular electrode (2) having a billet-entry side and a billet-egress side and defining a billet-treatment orifice, said annular electrode for producing an arc (1) within said billet-treatment orifice;
  a magnetic coil (3) having a billet-entry side and a billet-egress side and defining a billet-passage orifice, (3) said magnetic coil disposed proximate said billet-egress side of said annular electrode (2), said annular electrode disposed in a non-homogeneous magnetic field of said magnetic coil, said magnetic coil producing rotational movement of said arc (1) around said billet (8);
  a plurality of guide elements (5,6) for centering said billet (8) in said billet-treatment orifice of said annular electrode (2) and in said billet-passage orifice of said magnetic coil (3); and
  first and second contacts (14a, 13a) arranged to contact said billet on said billet-entry and billet-egress sides of said annular electrode, respectively, such that an arc is formed between said billet and said annular electrode from current contributions from said first and second contacts.

9. The device according to claim 8, characterized by the fact that each of said first and second contacts (13a, 14a) is connected to a corresponding controllable contact current source, (13, 14) and each of said corresponding controllable contact current sources is also connected to said annular electrode (2).

10. The device according to claim 8, characterized by the fact that a plurality of nozzles (11) supplying inert gas within said billet-treatment orifice is arranged on said billet-egress side of said magnetic coil.

11. The device according to claim 8, characterized by the fact that a separately controllable magnetic coil current supply (12) is provided for said magnetic coil (3).

12. The device according to claim 8, characterized by the fact that at least one pulse generator is associated with said controllable contact current sources.

13. The device according to claim 8, characterized by the fact that said annular electrode (2) and said magnetic coil (3) are surrounded by a housing (7) defining holes for the billet (8) to pass through.

14. The device according to claim 8, characterized by the fact that said annular electrode (2), said magnetic coil (3) and said plurality of guide elements (6) disposed proximate said billet-egress side of said magnetic coil are connected to a water coolant system.

* * * * *